US012676559B2

(12) United States Patent
Stamatiou et al.

(10) Patent No.: US 12,676,559 B2
(45) Date of Patent: Jul. 7, 2026

(54) POWER ELECTRONIC BUILDING BLOCK FOR MODULAR MULTILEVEL CONVERTERS

(71) Applicant: Hitachi Energy Ltd, Zürich (CH)

(72) Inventors: Georgios Stamatiou, Västerås (SE); Aravind Mohanaveeramani, Västerås (SE)

(73) Assignee: Hitachi Energy Ltd, Zürich (CH)

( * ) Notice: Subject to any disclaimer, the term of this patent is extended or adjusted under 35 U.S.C. 154(b) by 314 days.

(21) Appl. No.: 18/563,870

(22) PCT Filed: May 25, 2021

(86) PCT No.: PCT/EP2021/063876

§ 371 (c)(1),
(2) Date: Nov. 22, 2023

(87) PCT Pub. No.: WO2022/248018

PCT Pub. Date: Dec. 1, 2022

(65) Prior Publication Data

US 2024/0235413 A1     Jul. 11, 2024

(51) Int. Cl.
*H02M 7/00*     (2006.01)
*H02G 5/00*     (2006.01)
(Continued)

(52) U.S. Cl.
CPC ........... *H02M 7/003* (2013.01); *H02G 5/005* (2013.01); *H02M 7/4835* (2021.05); *H05K 7/14329* (2022.08)

(58) Field of Classification Search
CPC .... H02M 7/003; H02M 7/4835; H02G 5/005; H05K 7/14329
See application file for complete search history.

(56) References Cited

U.S. PATENT DOCUMENTS

2014/0286064 A1*  9/2014  Kamizuma .............. H01G 2/08
                                                       361/301.5
2016/0226367 A1    8/2016  Raubo et al.
                           (Continued)

FOREIGN PATENT DOCUMENTS

CN        202395663 U      8/2012
CN        103427669 A      12/2013
          (Continued)

OTHER PUBLICATIONS

Machine translation of WO2012136457 by Clarivate Analytics, Nov. 2025, 8 pages.*
(Continued)

*Primary Examiner* — Harry R Behm
(74) *Attorney, Agent, or Firm* — PROCOPIO, CORY, HARGREAVES & SAVITCH LLP

(57) ABSTRACT

A power electronic building block is provided, including capacitors, switch modules, a busbar arrangement, and at least one AC busbar. Connection points of the at least one AC busbar are arranged symmetrically along a first direction with respect to a plane perpendicularly intersecting the first direction, and the at least one AC busbar includes a hole elongated along the first direction and configured to balance one or more loop inductances between at least one AC external terminal point and the connection points. A modular multilevel converter (MMC) is also provided, including a plurality of converter arms each including at least one sub module formed by the PEBB.

14 Claims, 7 Drawing Sheets

(51) Int. Cl.
 *H02M 7/483* (2007.01)
 *H05K 7/14* (2006.01)

(56) References Cited

U.S. PATENT DOCUMENTS

| | | | | |
|---|---|---|---|---|
| 2019/0199237 | A1* | 6/2019 | Dorn | H02M 7/49 |
| 2021/0075339 | A1* | 3/2021 | Ido | H02M 7/4835 |
| 2024/0048063 | A1* | 2/2024 | Bryant | H02M 1/0095 |

FOREIGN PATENT DOCUMENTS

| | | | | | |
|---|---|---|---|---|---|
| CN | 103856073 | A | | 6/2014 | |
| CN | 104167933 | A | | 11/2014 | |
| CN | 204046403 | U | | 12/2014 | |
| CN | 204068668 | U | | 12/2014 | |
| CN | 204089615 | U | | 1/2015 | |
| CN | 204145263 | U | | 2/2015 | |
| CN | 105355611 | A | | 2/2016 | |
| CN | 205829472 | U | * | 12/2016 | |
| CN | 107809166 | A | | 3/2018 | |
| CN | 207475418 | U | | 6/2018 | |
| CN | 108923618 | A | | 11/2018 | |
| CN | 109687724 | A | | 4/2019 | |
| CN | 109887908 | A | | 6/2019 | |
| CN | 110098748 | A | | 8/2019 | |
| CN | 110266199 | A | | 9/2019 | |
| CN | 209963431 | U | | 1/2020 | |
| CN | 210016396 | U | | 2/2020 | |
| CN | 210016424 | U | | 2/2020 | |
| JP | 2006019367 | A | | 1/2006 | |
| RU | 188617 | U1 | | 4/2019 | |
| WO | WO-2012136467 | A2 | * | 10/2012 | H02M 7/4835 |

OTHER PUBLICATIONS

Machine translation of CN 205829472 by Clarivate Analytics, Nov. 2025, 6 pages.*

* cited by examiner

POWER ELECTRONIC BUILDING BLOCK FOR MODULAR MULTILEVEL CONVERTERS

CROSS-REFERENCE TO RELATED APPLICATIONS

This application is US National Stage of International Patent Application PCT/EP2021/063876, filed May 25, 2021, the contents of which is incorporated herein by reference.

TECHNICAL FIELD

The present disclosure relates to the field of modular multilevel converters (MMCs). In particular, the present disclosure relates to so called power electronic building blocks (PEBBs) for such MMCs.

BACKGROUND

A power electronic building block (PEBB) is typically defined by identifying a plurality of components within a larger structure of e.g. a converter valve that together serve a functional purpose of an individual converter cell. In the event of an internal failure in, or need for maintenance of, such a PEBB, the whole part of the converter valve in which the PEBB is located usually needs to be decommissioned in order to access the affected PEBB, even if only a single contained PEBB is involved. In addition, the exact design of the converter valve is often inherently connected to the design of the PEBB itself. Phrased differently, the design of the converter valve itself is usually delayed until the exact design of the PEBB is known.

In addition, existing PEBBs are usually built around the use of a single switch of a certain current rating. These switches are often of so called "Presspack" type, and do not easily allow for parallelization of multiple switches. If there is a need to design a converter station with higher valve current rating, a different switch with higher current rating often needs to be selected. If the packaging of this switch is different from that of the previous one, accommodating the new switch may require for the whole PEBB to be redesigned.

Switches of so called "LinPak" type are however known to be easier to parallelize, and such switches may offer an improved potential to scale-up the valve of a converter in terms of for example current rating. However, parallelizing switches may introduce new challenges of for example proper current sharing among multiple switches, the capacitors of the PEBB and the protection mechanisms of the PEBB that need to react preferably identically to incidents and failures of any of the parallel switches.

Based on the above, there is therefore a need for a more flexible PEBB design which takes the above issues into consideration.

SUMMARY

To at least partly satisfy the above identified need, the present disclosure provides a power electronic building block (PEBB) for use in e.g. a modular multilevel converter (MMC) as defined by the exemplary aspects of the present invntion. Further embodiments of the PEBB are defined by the dependent claims.

According to one aspect of the present disclosure, a power electronic building block (PEBB) is provided as defined by independent claim 1. The PEBB includes a plurality of capacitors. The PEBB includes a plurality of switch modules, each switch module including a first terminal, a second terminal and a third terminal, at least one semiconductor switch connected between the first terminal and the third terminal, and at least one semiconductor switch connected between the second terminal and the third terminal. The PEBB includes a busbar arrangement, including one or more busbars connecting the first terminals of the plurality of switch modules together, connecting the second terminals of the plurality of switch modules together, and connecting the plurality of capacitors in parallel across the first terminals and the second terminals of the plurality of switch modules. The PEBB further includes at least one AC busbar including a plurality of connection points connecting the third terminals of the plurality of switch modules together via said at least one AC busbar, and at least one AC terminal point. In the PEBB, the plurality of connection points of the at least one AC busbar are arranged symmetrically along a first direction with respect to a plane perpendicularly intersecting the first direction. Further, in the PEBB, the at least one AC busbar further includes a hole elongated along the first direction and configured to balance one or more loop inductances between the at least one AC external terminal point and the plurality of connection points.

In some embodiments, the plurality of capacitors may be a plurality of can type film capacitors.

In some embodiments, the plurality of capacitors may be a plurality of box type film capacitors.

In some embodiments, the PEBB may further include a DC crowbar thyristor and clamping apparatus connected in parallel with the plurality of capacitors.

In some embodiments, the PEBB may further include at least two AC busbars, and further include a bypass switch connected across said at least two AC busbars.

In some embodiments, the busbar arrangement may include a capacitor busbar for connecting the plurality of capacitors in parallel, and a switch busbar connected to the capacitor busbar for connecting the plurality of capacitors in parallel across the first terminals and the second terminals of the plurality of switch modules.

In some embodiments, the capacitor busbar may include a hole elongated along the first direction and configured to balance one or more loop inductances within the capacitor busbar.

In some embodiments, the capacitor busbar may have a U-shape, and the plurality of capacitors may be provided on both sides of one end of said U-shape.

In some embodiments, wherein the busbar arrangement may further include a clamp busbar connected to the capacitor busbar for connecting the DC crowbar thyristor clamp in parallel with the plurality of capacitors.

In some embodiments, the busbar arrangement may include a capacitor busbar for connecting the plurality of capacitors in parallel, a main busbar connected to the capacitor busbar, and a switch busbar connected to the main busbar for connecting the plurality of capacitors in parallel across the first terminals and the second terminals of the plurality of switch modules via said main busbar.

In some embodiments, the main busbar may further be configured for connecting the DC crowbar thyristor clamp in parallel with the plurality of capacitors.

In some embodiments, the busbars of the busbar arrangement may be laminated busbars.

In some embodiments, the PEBB may be of a half-bridge type where the plurality of switch modules forms a single group of switch modules, and wherein the at least one AC busbar includes a first AC busbar connecting the third terminals of the plurality switch modules together and a second AC busbar connected to the first or second terminals of the plurality of switch modules.

In some embodiments, the PEBB may be of a full-bridge type where the plurality of switch modules are divided into a first group of switch modules and a second group of switch modules, and wherein the at least one AC busbar includes a first AC busbar connecting the third terminals of the first group of switch modules together and a second AC busbar connecting the third terminals of the second group of switch modules together.

According to a second aspect of the present disclosure, a modular multilevel converter (MMC) is provided. The MMC includes a plurality of converter arms, each converter arm including at least one sub module formed by a PEBB according to the first aspect.

The present disclosure relates to all possible combinations of features recited in the claims. Objects and features described according to the first aspect may be combinable with, or replaced by, objects and features described according to the second aspect, and vice versa.

Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

Figure 1A:
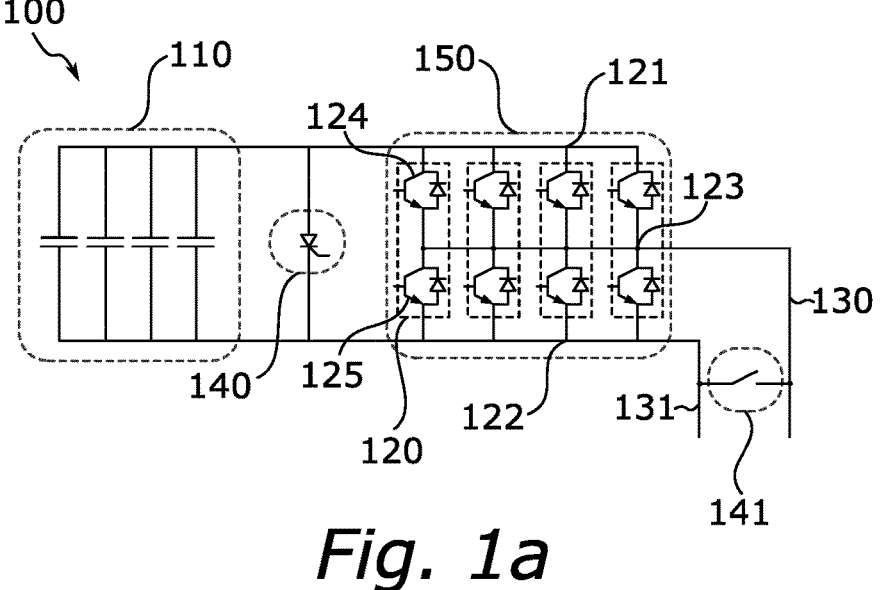
FIGS. 1a and 1b schematically illustrate electrical circuits corresponding to electrical equivalents of various embodiments of a PEBB according to the present disclosure.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

FIG. 1a schematically illustrates an electrical circuit 100 corresponding to an electrical equivalent of an embodiment of a PEBB according to the present disclosure. The circuit 100 includes a plurality of capacitors 110 and a first group 150 of a plurality of switch modules 120. Each switch module 120 has a first terminal 121, a second terminal 122, and a third terminal 123. Each switch module 120 further includes at least one semiconductor switch 124 connected between the first terminal 121 and the third terminal 123, and at least one semiconductor switch 125 connected between the second terminal 122 and the third terminal 123. Here, "at least one" semiconductor switch means that there may be a single such switch, or multiple such switches connected e.g. in series between each of the first/second terminal 121/122 and third terminal 123. The switch modules 120 may for example be of a "LinPak"-type.

The circuit 100 further includes a busbar arrangement which connects the first terminals 121 of the switch modules 120 together, which connects the second terminals 122 of the switch modules 120 together, and which connects the plurality of capacitors 110 in parallel across the first terminals 121 and the second terminals 122 of the switch modules 120. In the circuit 100, the "busbar arrangement" is represented by the connection lines drawn between the various components.

The circuit 100 further includes a first AC busbar 130 which connects all of the third terminals 123 of the switch modules 120 together. A second AC busbar 131 is connected to the second terminals 122. The circuit 100 is of a half-bridge type with multiple switches and capacitors in parallel. As shown in the circuit 100, a DC crowbar thyristor and clamping apparatus 140 and a bypass switch 141 may also be provided, although it is envisaged that one or both of the components 140 and 141 are optional.

Figure 1B:
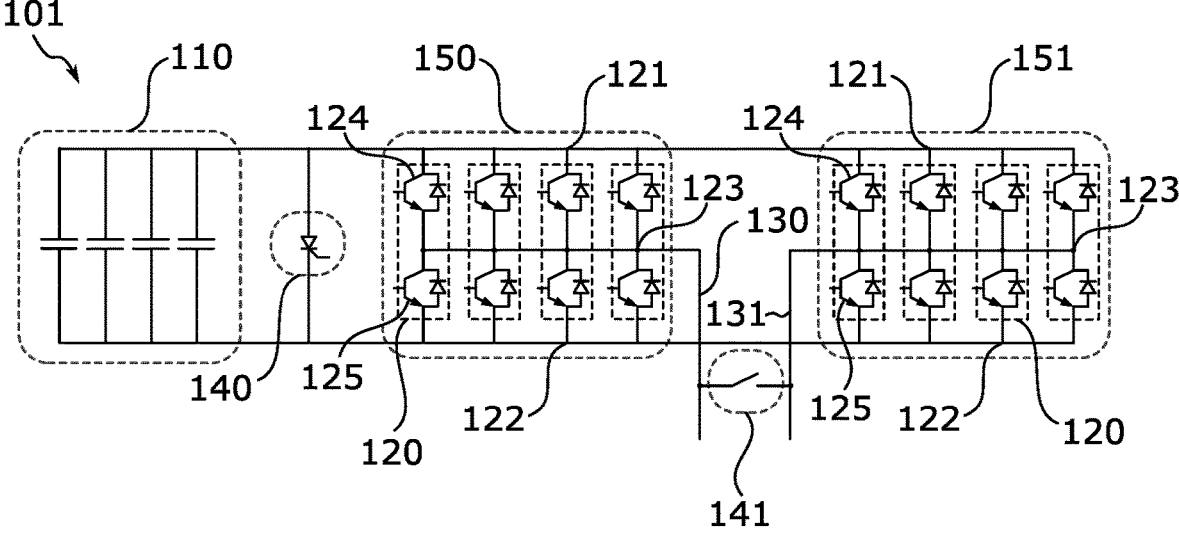

FIG. 1b schematically illustrates another electrical circuit 101 corresponding to an electrical equivalent of a further embodiment of a PEBB according to the present disclosure. The circuit 101 is similar to the circuit 100 described above with reference to FIG. 1a, except that it is of a full-bridge type wherein both a first group 150 and a second group 151 of switch modules 120 are provided. The busbar arrangement (once again illustrated by the lines drawn between the various components) connects the first terminals 121 of the first group 150 and second group 151 together, and also connects the second terminals 122 of the first group 150 and second group 151 together. The first AC busbar 130 connects the third terminals 123 of the switch modules 120 of the first group 150 together, and the second AC busbar 131 connects the third terminals 123 of switch modules 120 of the second group 142 together. As before, a DC crowbar thyristor and clamping apparatus 140 and/or a bypass switch 141 may also (optionally) be provided. In both the circuit 100 and the circuit 101, there are four capacitors 110 and four switch modules 120 in each group. It is, of course, envisaged that there may be e.g. less than four capacitors 120 or more than four capacitors 120 in each group, and that there may be e.g. less than four switch modules 120 or more than four switch modules 120 in each group. The exact number of capacitors and/or switch modules in each group may be adjusted based on e.g. a required current rating.

Using the AC busbars 130 and 131, multiple PEBBs (such as represented by the circuits 100 or 101) may be connected in series, thereby forming a plurality of converter cells within e.g. a converter valve arm.

The physical construction of one or more embodiments of a PEBB according to the present disclosure will now be described with reference to FIGS. 2a-2d.

Figure 2A:
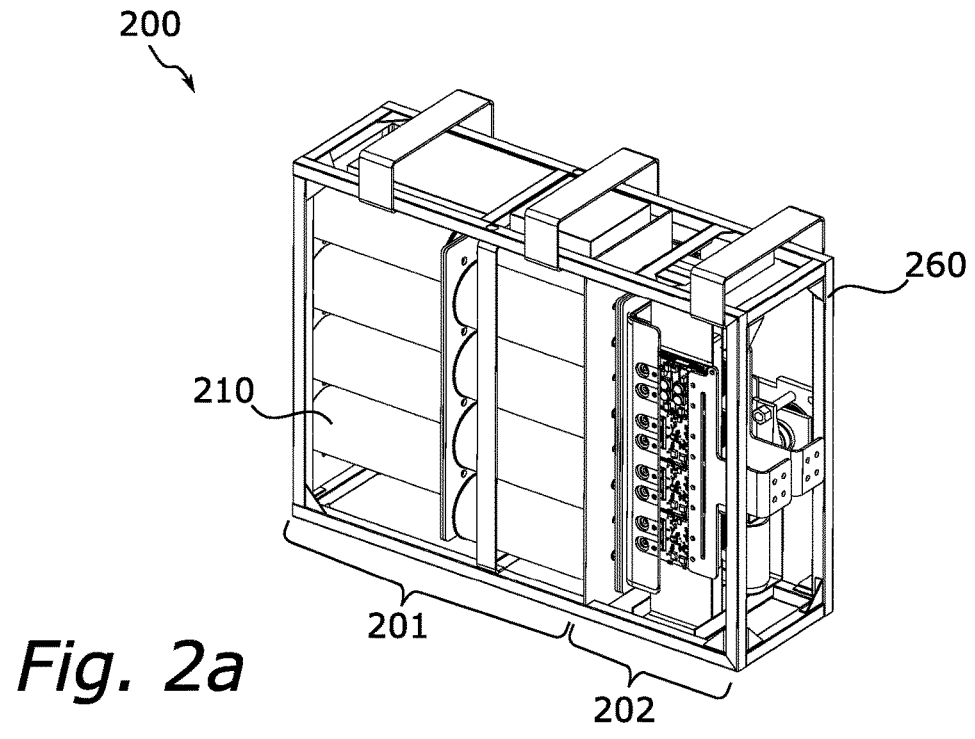
FIGS. 2a-d schematically illustrate various views of various embodiments of a can film capacitor type PEBB according to the present disclosure.

FIG. 2a schematically illustrates an embodiment of a PEBB 200, which is constructed as a standalone module of a full-bridge converter cell type. If not stated to the contrary, the electronical components (such as capacitors, switch modules, busbars, etc.) that will be described below correspond to those already discussed with reference to FIGS. 1a and 1b above.

The main structure of the PEBB 200 is built around a plurality of capacitors 210 which are connected in parallel and stacked next to each other. In the example given, there are 16 such capacitors, but it is of course envisaged that fewer or more capacitors may be used instead. A frame 260 (of for example metal/steel or any other suitable material) serves the purpose of providing structural and mechanical support for all components included in the PEBB 200. The PEBB 200 is physically divided into two main parts: a first compartment 201 which mainly houses the capacitors 210 and units containing low-voltage electronics; and a second compartment 202 which mainly houses the various busbars, power electronics, protection and bypassing equipment, and also for example cooling equipment and similar.

The latter compartment 202 may be surrounded externally by a number of plates made out of perforated material, serving the purpose of for example a) protecting the sensitive equipment underneath from environmental factors, b) allowing natural-convection air cooling of its contents, and c) containing internal failures and limit the spread of possible debris to nearby PEBBs and equipment in case of a failure. For reasons of clarity, in FIG. 2a, such cover plates are however not shown.

Figure 2B:
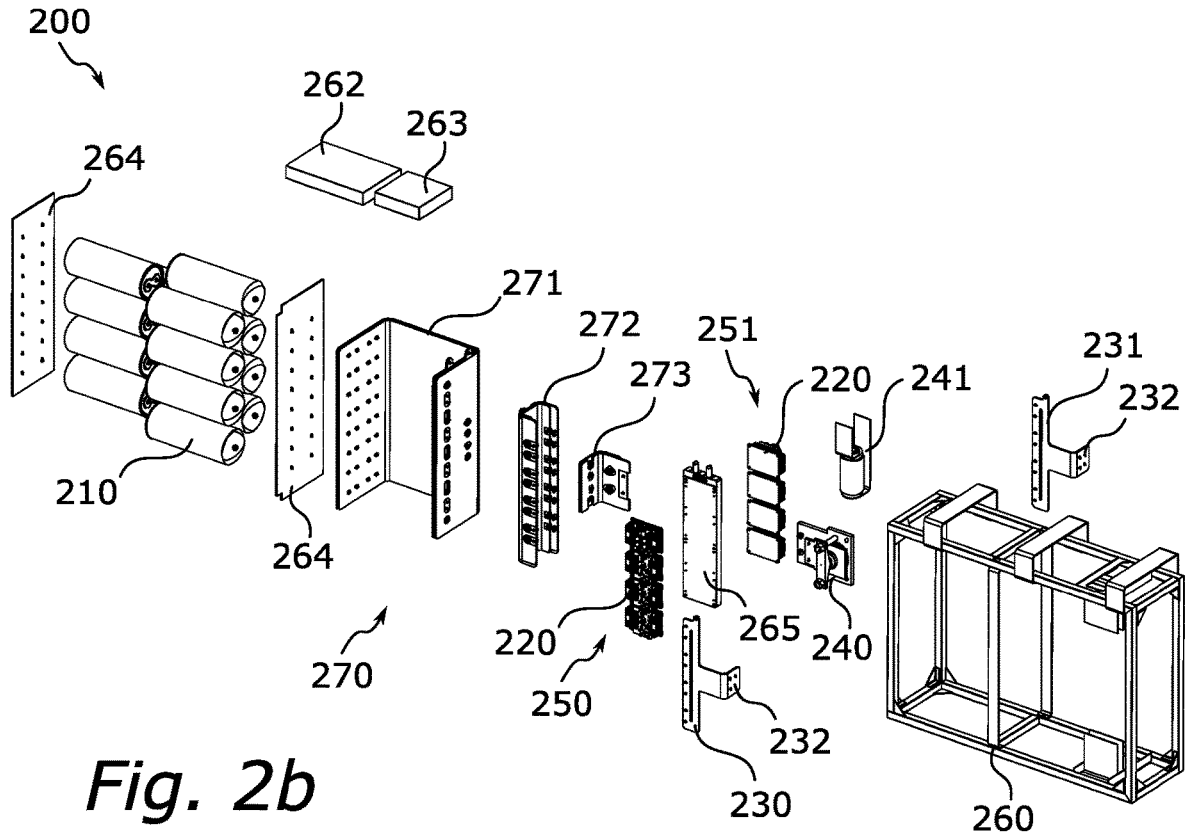

FIG. 2b schematically illustrates an exploded view of the PEBB 200. The PEBB 200 includes the plurality of capacitors 210, a first group 250 of switch modules 220, and a second group 251 of switch modules 220. The PEBB 200 also includes a busbar arrangement 270, including a capacitor busbar 271 and a switch busbar 271. This busbar arrangement 270 connects first terminals (not shown) of the switch modules 220 in the first group 250 and second group 251 together; connects the second terminals (also not shown) of the switch modules 220 in the first group 250 and in the second group 251 together; and connects the capacitors 210 together in parallel across the first and second terminals of the switch modules 120.

The PEBB 200 further includes a first AC busbar 230 and a second AC busbar 231. The first AC busbar 230 connects the third terminals (not shown) of the switch modules 220 of the first group 250 together, and the second AC busbar 231 connects the third terminals (also not shown) of the switch modules 220 of the second group 251 together. Each AC busbar 230 and 231 also has a respective AC external terminal point 232, with which the PEBB 200 may for example be connected in series with one or more other PEBBs in order to form for example a converter valve arm or similar.

The embodiment of the PEBB 200 as shown in FIG. 2b also includes a DC crowbar thyristor clamp 240 and an AC bypass switch 241, and the busbar arrangement 270 further includes a corresponding crowbar/clamp busbar 273 for connecting the DC crowbar thyristor (clamp) as shown in e.g. FIG. 1b. Likewise, the AC bypass switch 241 is connected between the first AC busbar 230 and the second AC busbar 231, and allows to bypass the PEBB 200 in case of for example a failure. As discussed earlier herein, these additional components may in some other embodiments be optional.

In the PEBB 200, a frame 260 (of for example steel or any other suitable material) is provided to hold all components in place. The components of the PEBB 200 may, as illustrated in FIG. 2b, also additionally include for example various control and power supply boxes 262 and 263 for e.g. the switch modules 220, various support structures 264 for the capacitors 210, heatsink arrangements 265 for the switch modules 220, and similar.

As described above, the PEBB 200 corresponds to the full-bridge circuit 101 shown in and described with reference to FIG. 1b. Although it will, for the sake of clarity, not be illustrated herein, a PEBB corresponding to a half-bridge circuit 100, as shown in and described with reference to FIG. 1a, can be constructed by modifying the PEBB 200, for example by removing one group 251 of switch modules and by e.g. instead providing/connecting the then left-over AC busbar 231 to the second terminals of the remaining group of switch modules.

Figure 2C:
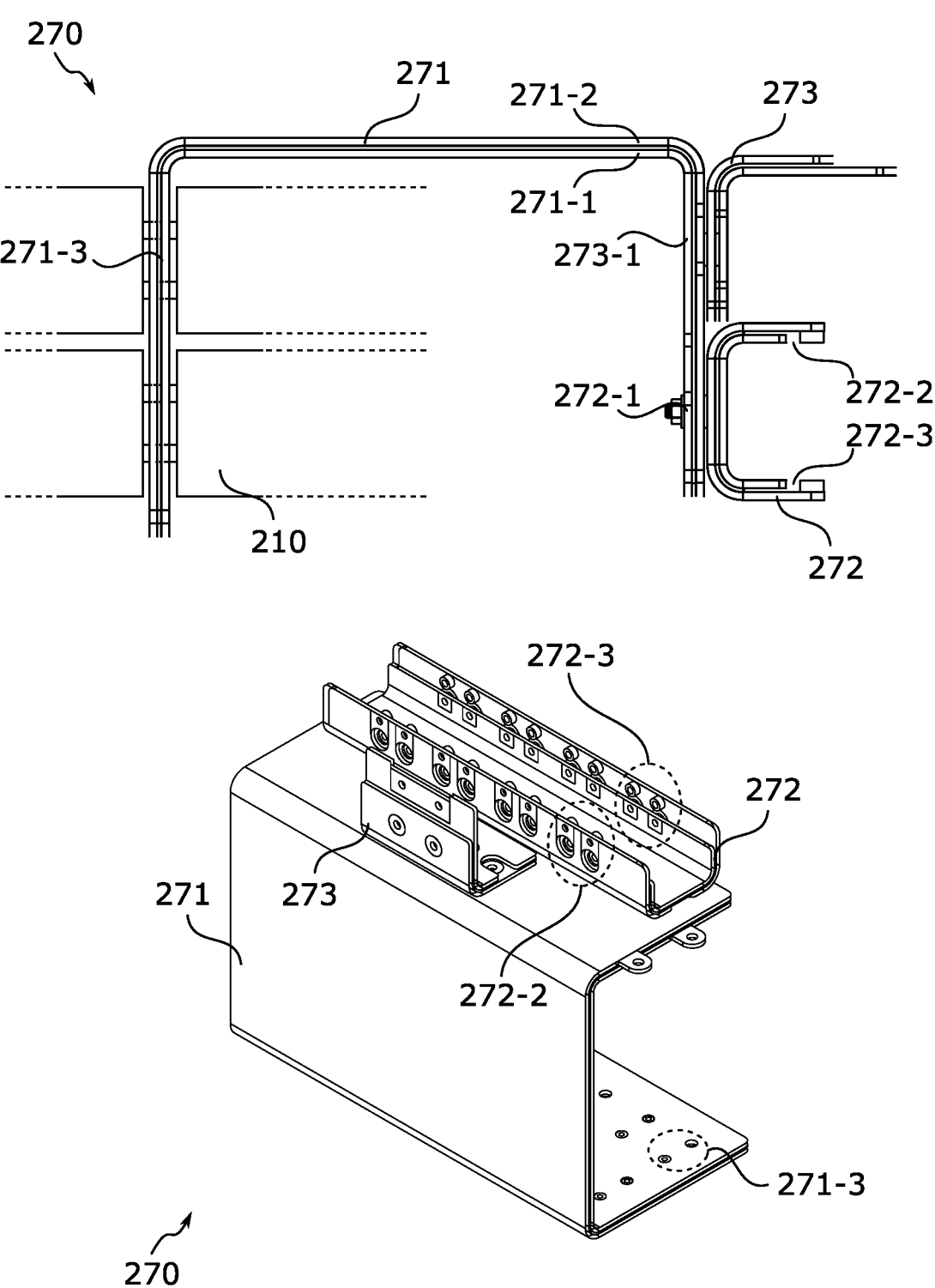

FIG. 2c schematically illustrates side and perspective views of the busbar arrangement 270 of the PEBB 200, including the capacitor busbar 271, the switch busbar 272, and the (optional) crowbar/clamp busbar 273. The capacitor busbar 271 is a laminated busbar which connects in parallel the capacitors 210 of the PEBB, and provides terminal DC+ and DC− connections 271-1 and 271-2 to the rest of the busbar arrangement 270. The connections 271-3 to the capacitors 210 are provided on one edge of the capacitor busbar 271, and a feature of this capacitor busbar 271 is that the capacitors 210 are arranged on both sides of this end of the capacitor busbar 271. This ensures that a maximum number of capacitors 210 may be connected in parallel, while occupying a smaller surface area of the capacitor busbar 271. As a result, all of the capacitors 210 are electrically very close to each other and therefore: a) there is equal or almost equal current sharing between the capacitors 210, and b) a loop inductance between each individual capacitor 210 and other electrical components of the PEBB may be identical or almost identical. Further, the capacitor busbar 271 is here bent into a "U-shape", where the internal cavity of the shape houses a number (e.g. half) of the capacitors 210. This provides the benefit of being able to make the PEBB more compact. Additionally, there is sufficient space left between all neighboring capacitors 210 on both sides of the capacitor busbar 271, which allows for more easily accessing e.g. bolts for connecting the capacitors 210 placed on the opposite side of the capacitor busbar 271. If required, holes may be provided on the capacitor busbar 271 to assist e.g. the heat dissipation from the capacitors 210 via for example natural-convection air cooling.

The switch busbar 272 and clamp busbar 273 are connected to the capacitors 210 and the capacitor busbar 271 via connection points 272-1 and 273-1 found on the other edge of the capacitor busbar 271. All of the capacitor busbar 271, the switch busbar 272 and the clamp/crowbar busbar 273 are laminated busbars, such that a single busbar may be used to carry e.g. current in two directions. The switch busbar 272 is also "U-shaped" and houses the switch modules 220. Each of the two sides of the U-shape is used to connect the parallel switch modules that constitute the switch groups 250 and 251, respectively. As the example provided here has a total of eight switch modules (four in each group), there are eight connection points 272-2 on one side for the switch modules in the first group 250 and another eight connection points 272-3 on the other side for the switch modules in the second group 251 (as each switch module connects to the switch busbar 272 using a respective first and second terminal). For other numbers of switch modules, it is of course envisaged that the numbers of connection points 272-2 and 272-3 are adapted accordingly. The internal cavity of the U-shape is here wide enough to accommodate the two groups 250 and 251 of switch modules 220 as well as a heatsink arrangement (not shown) therein between, such that the two groups 250 and 251 are connected on either side of the heatsink arrangement 265 and thereby receives additional cooling. The connection points 272-1, through which the switch busbar 272 connects to the DC+ and DC− connections 271-1 and 271-2 of the capacitor busbar 271, may for example be or include bolts or similar for providing both structural and electrical connection between the capacitor busbar 271 and the switch busbar 272.

It is noted that in case a half-bridge type PEBB is wanted instead of the full-bridge type discussed here, the switch busbar 272 may for example be excluded and the switch modules 220 connected directly to the capacitor busbar 271.

In another such example, the switch busbar 272 may remain, but for example have only a "half-U-shape" or similar (such as an "L-shape"). Other variants are of course also possible.

Figure 2D:
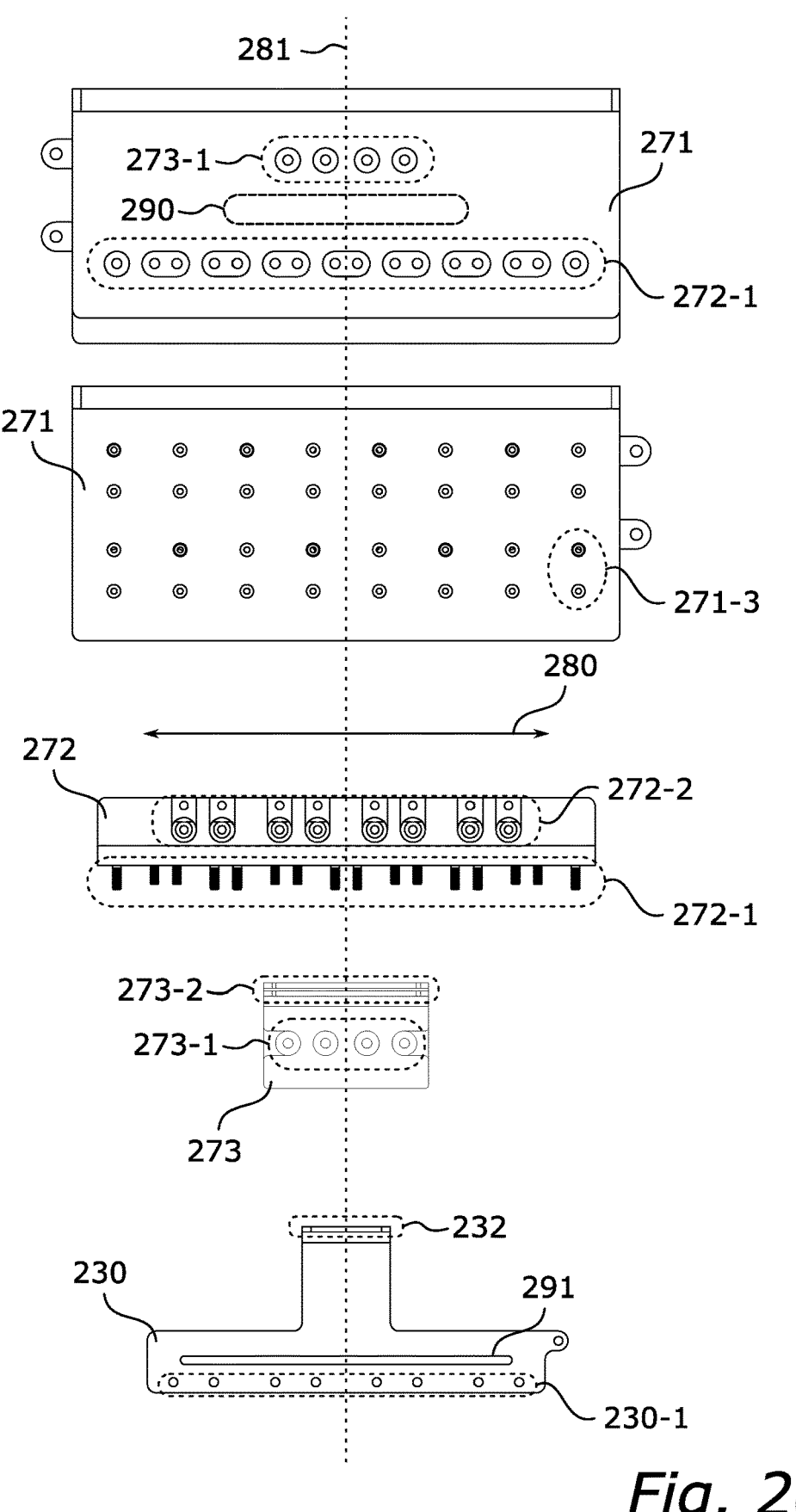

FIG. 2d schematically illustrates side/front views of the capacitor busbar 271, the switch busbar 272, the clamp busbar 273, as well as the AC busbar 230/231.

The various connection points 272-1 and 273-1, connecting the capacitor busbar 271 and the switch busbar 272, and connecting the capacitor busbar 271 and the clamp busbar 273, respectively, are all arranged along a first direction illustrated by the arrow 280. The same applies for the connection points 271-3 connecting the capacitors 210 to the capacitor busbar 271. In FIG. 2d, a single pair of connection points 271-3 are marked, but it is to be understood that "connection points 271-3" refers to all such pairs of connection points connecting the capacitors 210 to the capacitor busbar 271. Although the connection points 271-3 are arranged in multiple rows, it is to be understood that each such row extends in the direction 280, and that this means that the connection points 271-3 are "arranged along the direction 280".

The various connection points 271-3, 272-1 and 273-1 are all arranged symmetrically with respect to a plane 281 which perpendicularly intersects the first direction 280. This symmetric design of the busbars and the busbar arrangement ensures a particular degree of symmetry in the loop inductance regarding the DC crowbar-to-capacitors loop and the DC crowbar-to-switches loop.

As illustrated by the dashed feature 290, an optional hole which elongates along the first direction 280 may be included/provided in the capacitor busbar 271 to further help equalizing such loop inductances in case they are far from a desired target. Likewise, the design of the capacitor busbar 271 may further allow to minimize the loop inductances involving the DC crowbar, by placing the connection points 273-1 of the clamp busbar 273 electrically close to both the capacitors 210 and the switches in the switch modules 220.

The AC busbar 230 includes a plurality of connection points 230-1 for connecting the third terminals 223 of the first group 250 of switch modules 220 together. The AC busbar 230 also includes at least one AC external terminal point 232, via which the AC busbar 230 and the PEBB 220 may be connected e.g. in series with one or more other PEBBs. The plurality of connection points 230-1 are arranged along the first direction indicated by the arrow 280. Herein, when referring to one or more components (such as various connection points) being arranged along a certain direction, or being arranged symmetrically with respect to a common plane, it is envisage that this applies at least once the various parts (such as the various busbars) are mounted together as part of the PEBB 220. The plurality of connection points 230-1 are also arranged symmetrically with respect to the plane 281 which perpendicularly intersects the first direction 280. In addition, the AC busbar 230 is also provided with (or includes) a hole 291 which is elongated (or elongates) along the first direction 280, and which is configured (i.e. dimensioned, positioned, etc.) to balance one or more loop inductances between the at least one AC external terminal point 232 and the plurality of connections 230-1. The hole 291 is envisaged to counteract that the loop inductances of e.g. switches at the extremities and central position of the AC busbar 230 would differ significantly, which would create an imbalance in current sharing between the switches. It is envisaged that the hole 291 is also symmetric with respect to the plane 281. By introducing the elongated hole, and by proper configuration thereof in terms of exact dimensions and position (which may vary with the exact geometry of the AC busbar 230, the number of switches, etc.), it has been further envisaged that the loop inductances can be made as close to identical as possible, bringing balance to the current sharing of the parallel switches. Likewise, any protection mechanism is then allowed to act equally on any of the parallel switches. The desired effect may be thought of as resulting from the hole 291 forcing all current paths between the (third terminals of the) switches/switch modules and the at least one AC external terminal point 232 to become approximately equal, or at least more equal in length than if no such hole 291 was provided. The AC busbar 230 can be a laminated busbar, or be made of exposed metal, where the latter would for example most likely reduce the total cost as long as sufficient electrical clearance is provided between the AC busbar 230 and e.g. other PEBB items.

A similar or identical construction as that for the AC busbar 230 may also be provided for the other AC busbar 231. It is also envisaged that the two AC busbars 230 and 231 may differ in their construction while still retaining e.g. the discussed symmetries, in order to for example better accommodate a potential space-arrangement requirement within the PEBB and a required electrical functionality.

Depending on a desired energy of a converter cell and of the PEBB forming such a cell, different numbers of capacitors may be added in parallel. An increase in the number of capacitors may be accompanied by an increase in the number of parallel switch modules. In order to accommodate an increase in either or both of capacitors and switch modules, the PEBB as disclosed herein has the benefit that only the lengths of the various busbars 271 and 272 (and e.g. heatsink arrangements) will grow, while their otherwise structural and electrical symmetries can still be maintained. The overall shape of the PEBB will therefore be maintained, only increasing in length in a direction related to the way in which the capacitors are added to the PEBB. For example, by adding more capacitors (symmetrically with respect to the plane 281) in the first direction 280, it can be expected that the busbars and the PEBB will also grow only in this direction. The placement of other components within the PEBB can remain the same, and the remaining dimensions of the PEBB will be stationary (except for e.g. the frame supporting the components). This has the benefit that a converter valve (hall) may be designed having these predefined "fixed" and "variable" dimensions in mind, and take into account that additional space may be needed if e.g. a current rating of the PEBB is to be increased, but then only in e.g. a single "variable" dimension. The PEBB as disclosed and envisaged herein therefore provides a flexible arrangement, where the scalability may be enhanced without requiring much or any reconfiguration of the converter valve (hall) itself. It is for example envisaged that an increased current rating may be provided by rebuilding an already existing PEBB by adding lengthened busbars where needed, and additional switches and capacitors, or for example by replacing the PEBB completely with another PEBB in which these changes have already been taken into account. For example, it is envisaged that the PEBBs may be manufactured and delivered in standardized sizes, each containing a predefined number of switch modules and/or capacitors in parallel, and thereby offer a predefined current rating. Depending on the wanted current rating of the converter modules, a particular such PEBB size may be selected and considered while designing the converter valve.

In the PEBB 200 described with reference to FIGS. 2a-2d, the capacitors 210 are illustrated as being so called "can type film capacitors". It should be noted that such particular capacitors are only used as an example, and that the arrangement of the PEBB 200 can be beneficial and used also with other types of capacitors.

Another example embodiment of a PEBB according to the present disclosure will now be described with reference to FIGS. 3a-3d.

Figure 3A:
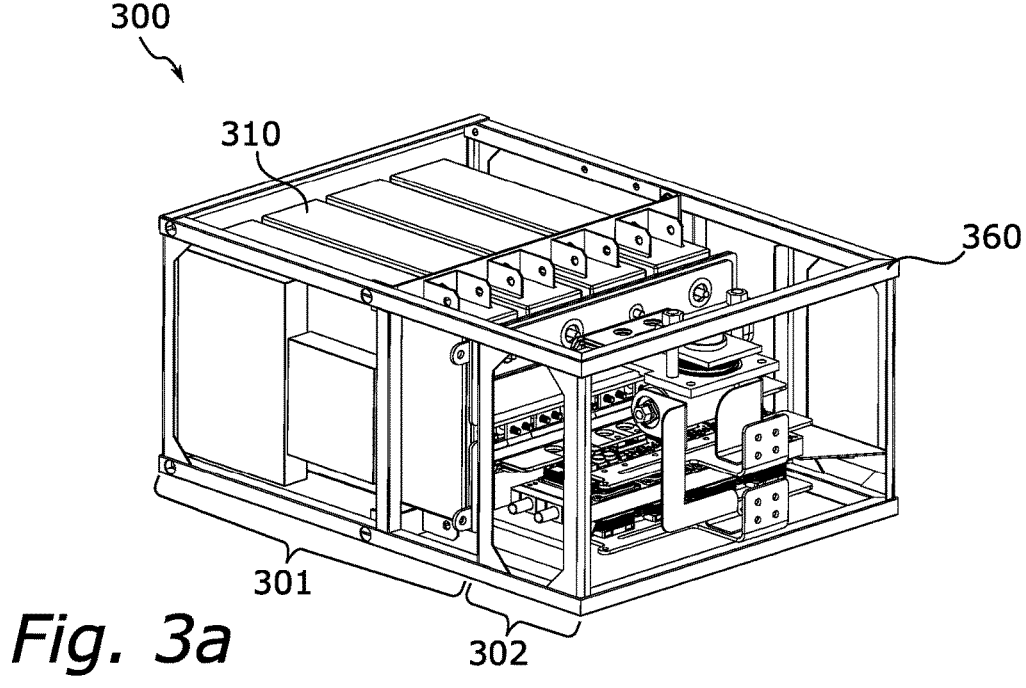
FIGS. 3a-d schematically illustrate various views of various embodiments of a box film capacitor type PEBB according to the present disclosure.

FIG. 3a schematically illustrates an embodiment of a PEBB 300 wherein the capacitors 310 are instead box type film capacitors. This PEBB 300 also correspond to the electrical equivalent described with reference to the circuit 101 shown in FIG. 1b.

The main structure of the PEBB 300 is built around a plurality of box type film capacitors 310 which are positioned next to each other. In the example given, there are four such capacitors, but it is of course envisaged that fewer or more capacitors may be used instead. A frame 360 (of for example metal/steel or any other suitable material) serves the purpose of providing structural and mechanical support for all components included in the PEBB 300. The PEBB 300 is physically divided into two main parts: a first compartment 301 which mainly houses the capacitors 310 and units containing low-voltage electronics; and a second compartment 302 which mainly houses the various busbars, power electronics, protection and bypassing equipment, and also for example cooling equipment and similar.

The latter compartment 302 may be surrounded externally by a number of plates 361 made out of perforated material, serving the purpose of for example a) protecting the sensitive equipment underneath from environmental factors, b) allowing natural-convection air cooling of its content, and c) containing internal failures and limit the spread of possible debris to nearby PEBBs and equipment in case of a failure. In FIG. 3a, for reasons of clarity, the PEBB 300 is shown without such cover plates.

Figure 3B:
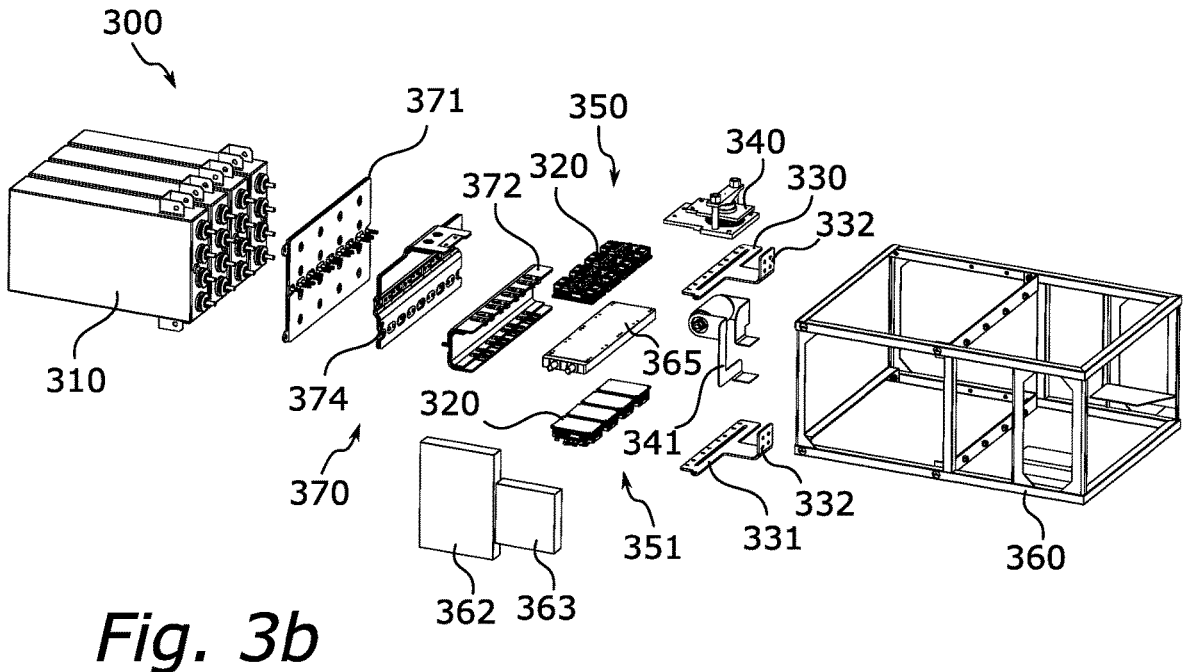

FIG. 3b schematically illustrates an exploded view of the PEBB 300. The PEBB 300 includes the plurality of (box) capacitors 310, a first group 350 of switch modules 320, and a second group 351 of switch modules 320. The PEBB 300 also includes a busbar arrangement 370, including a capacitor busbar 371, a switch busbar 372, and a main busbar 374. This busbar arrangement 370 connects first terminals (not shown) of the switch modules 320 in the first group 350 and second group 351 together; connects the second terminals (also not shown) of the switch modules 320 in the first group 350 and second group 351 together; and connects the capacitors 310 together in parallel across the first and second terminals of the switch modules 320. The PEBB 300 further includes a first AC busbar 330 and a second AC busbar 331. The first AC busbar 330 connects the third terminals (not shown) of the switch modules 320 of the first group 350 together, and the second AC busbar 331 connects the third terminals (also not shown) of the switch modules 320 of the second group 351 together. Each AC busbar 330 and 331 also has a respective AC external terminal point 332, with which the PEBB 300 may for example be connected in series with one or more other PEBBs, in order to form for example a converter valve arm or similar.

The embodiment of the PEBB 300 as shown in FIG. 3b also includes a DC crowbar thyristor clamp 340 and an AC bypass switch 341. The main busbar 374 is configured to connect the DC crowbar thyristor (clamp) as shown in e.g. FIG. 1b. Likewise, the AC bypass switch 341 is connected between the first AC busbar 330 and the second AC busbar 331, and allows to bypass the PEBB 300 in case of for example a failure. As discussed earlier herein, these additional components may in some other embodiments be optional.

In the PEBB 300, a frame 360 is provided to hold all components in place. The components of the PEBB 300 may, as illustrated in FIG. 3b, also additionally include for example various control and power supply boxes 362 and 363 for e.g. the switch modules 320, heatsink arrangements 365 for the switch modules 320, and similar.

The PEBB 300 corresponds to the full-bridge circuit 101 shown in and described with reference to FIG. 1b. Although it will, for the sake of clarity, not be illustrated herein, a PEBB corresponding to a half-bridge circuit 100, as shown in and described with reference to FIG. 1a, can be constructed by modifying the PEBB 300, for example by removing one group of switch modules, and by e.g. instead providing/connecting the then left-over AC busbar to the second terminals of the remaining group of switch modules.

Overall, the PEBB 300 is similar to the PEBB 200 described with reference to FIGS. 2a-2d, although with different capacitors 310 and with a different configuration of the busbar arrangement 370.

Figure 3C:
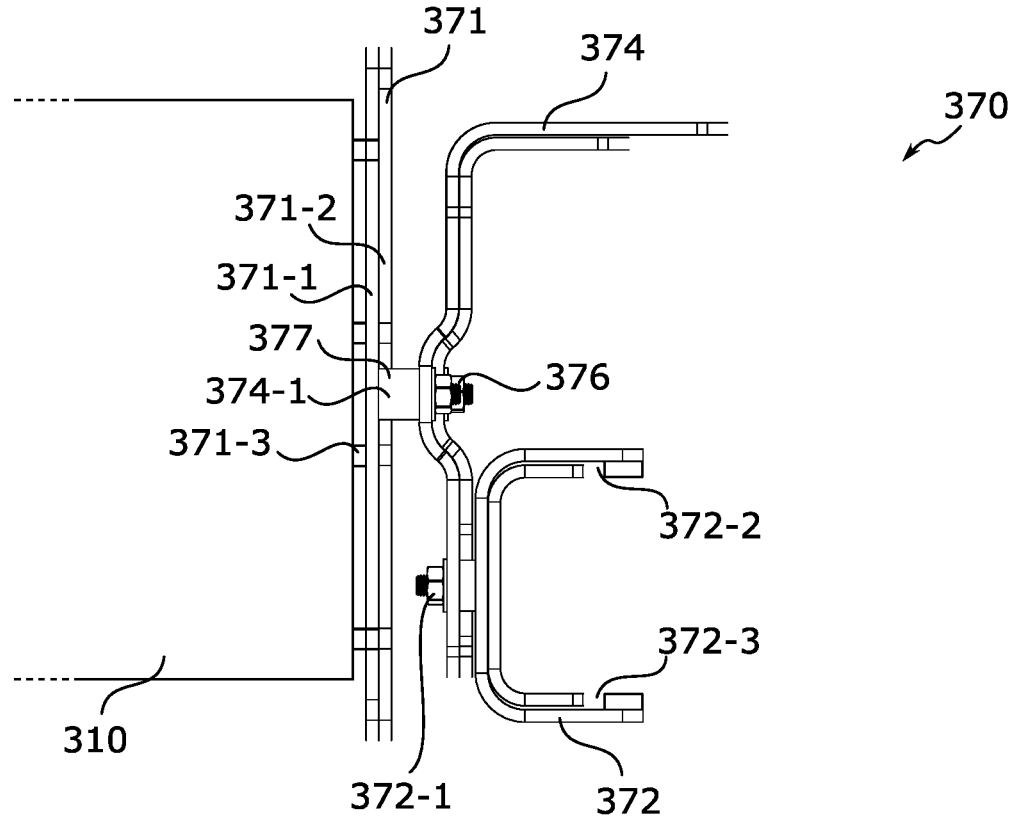
Figure 3C:
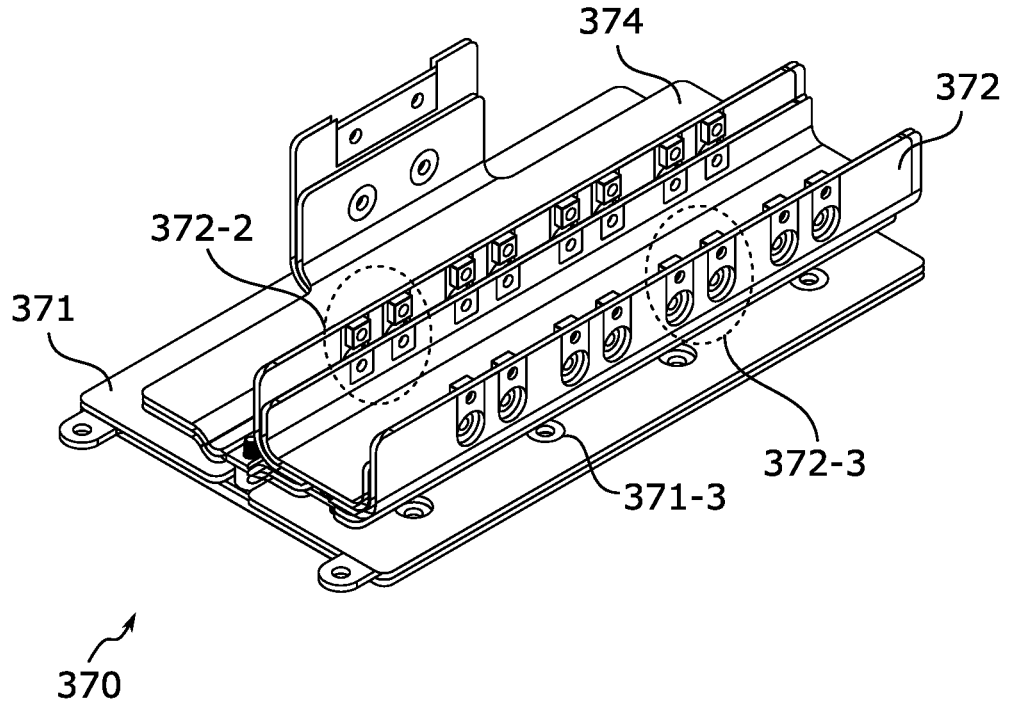

FIG. 3c schematically illustrates side and perspective views of the busbar arrangement 370 of the PEBB 300, including the capacitor busbar 371, the switch busbar 372, and the main busbar 374. The capacitor busbar 371 is a laminated busbar which connects in parallel the capacitors 310 of the PEBB 300, and provides terminal DC+ and DC− connections 371-1 and 371-2 to the rest of the busbar arrangement 370. In contrast to the capacitor busbar 271 of the PEBB 200 described with reference to FIGS. 2a-d, the capacitor busbar 371 is not "U-shaped" but instead flat, and the connections 371-3 to the capacitors 310 are provided in the region of the capacitor busbar 371 where the latter also connects further to the main busbar 374. In some embodiments, the DC+ and DC−1 connections 371-1 and 371-2 may be provided by a series of bolts 376, individually attached either on the DC+ or the DC− plate of the laminated capacitor busbar 371. These bolts 376 may be closely and evenly spaced, and may be found e.g. in the center of the capacitor busbar 371. This may ensure electrical symmetry in the design and equal current sharing between all capacitors 310 and the terminals of every individual capacitor 310. Furthermore, such bolts may be integrated within the capacitor busbar 371 itself, without any need to provide e.g. external access to items such as bolt heads. Such a construction may further help to make the PEBB 300 more compact in size.

In the PEBB 300, the switch modules 320 and the DC crowbar 340 are connected to the capacitors 310 via the intermediate main busbar 374. The main busbar 374 may be symmetrically designed, and may be connected to the capacitor busbar 371 via the integrated bolts 376 of the latter, at a set of connection points 374-1. There may also be e.g. metal lifting rings 377 provided for sufficient separation between the capacitor busbar 371 and the main busbar 374. In contrast with the PEBB 200 described with reference to FIGS. 2a-d, in the PEBB 300 the DC crowbar 340 (if included) may be connected directly to the main busbar 374, as the main busbar 374 provides DC+ and DC− connection points to the switch busbar 372 which houses and connects the switch modules 320.

The switch busbar 372 may be connected to the main busbar 374 via connection points 372-1, e.g. in the form of bolts or other suitable structures. The switch busbar 372 may in turn connect to the first and second terminals of the various switch modules via connection points 372-2 and 372-3, respectively, where e.g. the set of connection points 372-2 connects to the switch modules of the first group 350, while the set of connection points 372-3 connects to the switch modules of the second group 351.

Figure 3D:
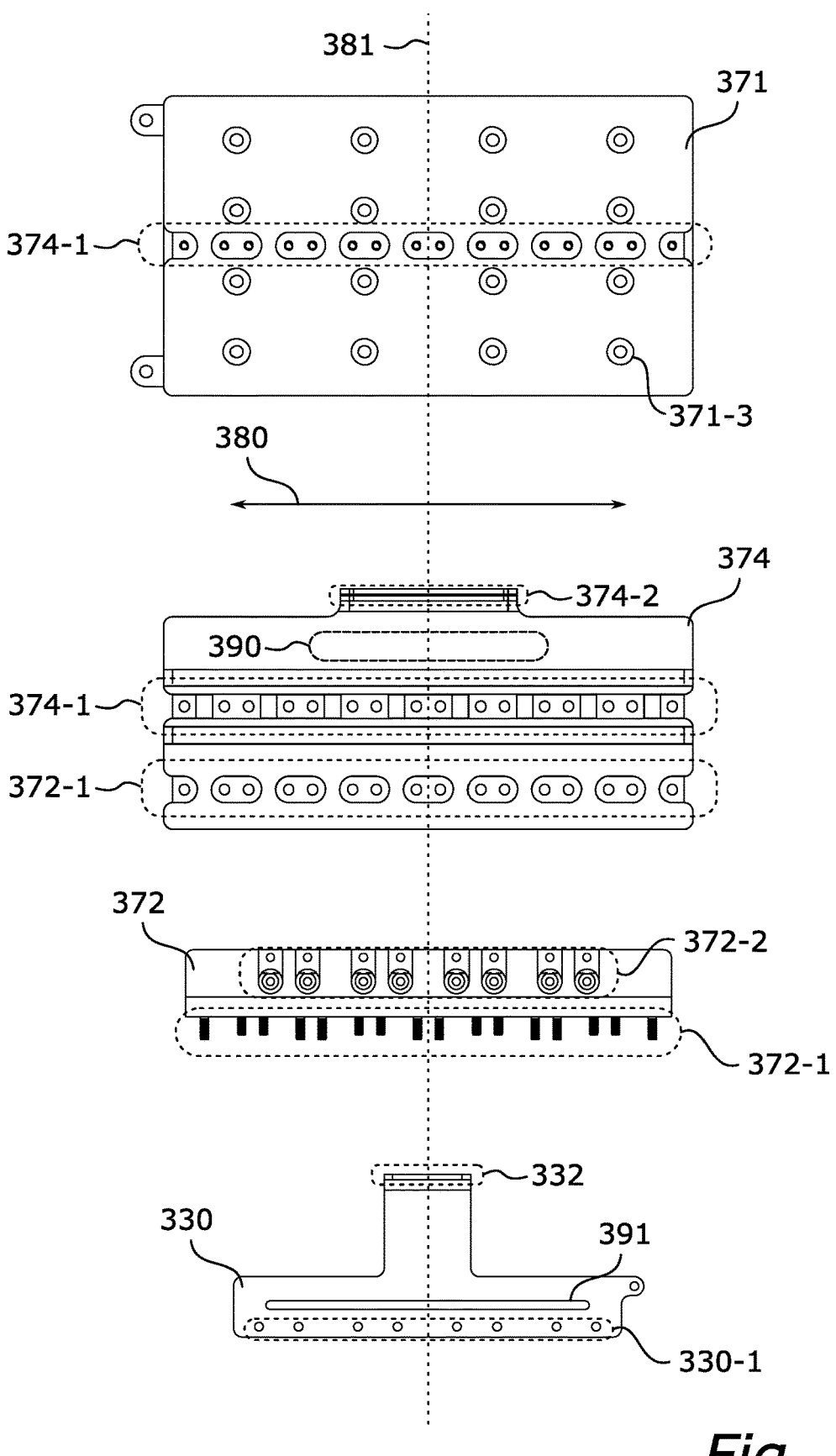

FIG. 3*d* schematically illustrates front/side views of the capacitor busbar 371, switch busbar 372 and the main busbar 374, as well as the AC busbar 330/331. The various connection points 374-1, connecting the main busbar 374 and the capacitor busbar 371, and the connection points 372-1, connecting the switch busbar 372 and the main busbar 374, are all arranged along a first direction illustrated by the arrow 380. The same applies for the connection points 371-3 connecting the capacitors 310 to the capacitor busbar 371, and for the connection points 372-2 (and 372-3) connecting the switch busbar 372 and respective first and second terminals of the switch modules 320. The various connection points 371-3, 372-1, 372-2/372-3 and 374-1 are all arranged symmetrically with respect to a plane 381 which perpendicularly intersects the first direction 380. This symmetric design of the busbars and the busbar arrangement ensures a particular degree of symmetry in the loop inductance regarding the DC crowbar-to-capacitors loop, and the DC crowbar-to-switches loop.

As illustrated by the dashed feature 390, an optional hole which elongates along the first direction 380 may be included in the main busbar 374 to further help equalizing such loop inductances in case they are far from target. Likewise, the design of the main busbar 374 may further allow to minimize the loop inductances involving the DC crowbar, by placing the connection points 374-1 where the main busbar 374 connects to an optional DC crowbar thyristor clamp 340 electrically close to both the capacitors 310 and the switches in the switch modules 320.

The various features of the switch busbar 372 may be similar or identical to those of the switch busbar 272 described already with reference to the PEBB 200 in FIGS. 2*a-d*, except that the switch busbar 372 connects to the main busbar 374 instead of directly to the capacitor busbar 371. Similarly, the AC busbar 330 may be similar or identical to the AC busbar 230 described with reference to the PEBB 200 in FIGS. 2*a-d*, and includes the elongated hole 391 in order to reduce any differences in loop inductance between the connection points 330-1 to the terminals of the switch modules 320 and the AC external terminal point 332. It is envisaged that the hole 391 is also symmetric with regards to the plane 381, and the same advantages and details as described earlier also apply to the AC busbar 330 (and the other AC busbar 331).

Overall, the two PEBBs 200 and 300 differ mainly in the type of capacitors used, and in the exact configuration of the respective busbar arrangements. However, the different advantages with respect to loop inductance, electrical symmetry, and scalability/modularity apply to both types of PEBBs.

In summary, the present disclosure provides a power electronic building block (PEBB) which offers both improved current sharing and reduced loop inductance. This is achieved mainly by the use of AC busbars having elongated holes, and may be further improved by arranging e.g. connection points symmetrically with respect to a plane extending perpendicularly to a direction along which the connection points are arranged.

In addition, such symmetry provides an improved scalability and modularity. Other advantages of the proposed embodiments includes the use of single or multiple non-Presspack power electronic switches in parallel; a compactness of the PEBB by the proposed placement of components and use of laminated busbars, in turn leading to a potential reduction of overall footprint of e.g. a converter valve hall;

an improved equality in terms of DC loop-inductance per switch module; the possibility to use off-the-shelf components to minimize cost; easy of construction and maintenance, and also the achievement of these goals without sacrificing mechanical structural integrity Although features and elements may be described above in particular combinations, each feature or element may be used alone without the other features and elements or in various combinations with or without other features and elements.

Additionally, variations to the disclosed embodiments may be understood and effected by the skilled person in practicing the claimed invention, from a study of the drawings, the disclosure, and the appended claims. In the claims, the words "comprising" and "including" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A power electronic building block (PEBB), comprising:
a plurality of capacitors;
a plurality of switch modules, each switch module of the plurality of switch modules including a first terminal, a second terminal and a third terminal, at least one first semiconductor switch connected between the first terminal and the third terminal, and at least one second semiconductor switch connected between the second terminal and the third terminal;
a busbar arrangement including one or more busbars connecting the first terminals of the plurality of switch modules together, connecting the second terminals of the plurality of switch modules together, and connecting the plurality of capacitors in parallel across the first terminals and the second terminals of the plurality of switch modules, via a first plurality of connection points, wherein the busbar arrangement includes a capacitor busbar configured to connect the plurality of capacitors in parallel, and a switch busbar connected to the capacitor busbar configured to connect the plurality of capacitors in parallel across the first terminals and the second terminals of the plurality of switch modules; and
at least one AC busbar including a second plurality of connection points connecting the third terminals of the plurality of switch modules together via said at least one AC busbar, and at least one AC terminal point,
wherein the second plurality of connection points of the at least one AC busbar are arranged symmetrically along a first direction with respect to a plane perpendicularly intersecting the first direction, and
wherein the at least one AC busbar includes a hole elongated along the first direction and configured to balance one or more loop inductances between the at least one AC terminal point and the second plurality of connection points.

2. The PEBB according claim 1, further including a DC crowbar thyristor and clamping apparatus connected in parallel with the plurality of capacitors.

3. The PEBB according to claim 1, including at least two AC busbars, and further including a bypass switch connected across said at least two AC busbars.

4. The PEBB according to claim 1, wherein the one or more busbars of the busbar arrangement are laminated busbars.

5. The PEBB according to claim 1, wherein the PEBB is of a half-bridge type, where the plurality of switch modules forms a single group of switch modules, and wherein the at least one AC busbar includes a first AC busbar connecting the third terminals of the plurality switch modules together and a second AC busbar connected to the first or second terminals of the plurality of switch modules.

6. The PEBB according to claim 1, wherein the PEBB is of a full-bridge type, where the plurality of switch modules are divided into a first group of switch modules and a second group of switch modules, and wherein the at least one AC busbar includes a first AC busbar connecting the third terminals of the first group of switch modules together and a second AC busbar connecting the third terminals of the second group of switch modules together.

7. The PEBB according to claim 1, wherein the plurality of capacitors is a plurality of can type film capacitors.

8. The PEBB according to claim 7, wherein the capacitor busbar includes the hole elongated along the first direction and configured to balance one or more loop inductances within the capacitor busbar.

9. The PEBB according to claim 7, wherein the capacitor busbar has a U-shape, and wherein the plurality of capacitors is provided on both sides of one end of said U-shape.

10. The PEBB according to claim 1, wherein the plurality of capacitors is a plurality of box type film capacitors.

11. A modular multilevel converter, MMC, including a plurality of converter arms, each converter arm including at least one sub module formed by a PEBB according to claim 1.

12. A power electronic building block (PEBB), comprising:

a plurality of capacitors;

a plurality of switch modules, each switch module of the plurality of switch modules including a first terminal, a second terminal and a third terminal, at least one first semiconductor switch connected between the first terminal and the third terminal, and at least one second semiconductor switch connected between the second terminal and the third terminal;

a busbar arrangement including one or more busbars connecting the first terminals of the plurality of switch modules together, connecting the second terminals of the plurality of switch modules together, and connecting the plurality of capacitors in parallel across the first terminals and the second terminals of the plurality of switch modules, via a first plurality of connection points, wherein the busbar arrangement includes a capacitor busbar configured to connect the plurality of capacitors in parallel, and a switch busbar connected to the capacitor busbar configured to connect the plurality of capacitors in parallel across the first terminals and the second terminals of the plurality of switch modules;

at least one AC busbar including a second plurality of connection points connecting the third terminals of the plurality of switch modules together via said at least one AC busbar, and at least one AC terminal point, wherein the second plurality of connection points of the at least one AC busbar are arranged symmetrically along a first direction with respect to a plane perpendicularly intersecting the first direction, and wherein the at least one AC busbar includes a hole elongated along the first direction and configured to balance one or more loop inductances between the at least one AC terminal point and the second plurality of connection points; and a DC crowbar thyristor and clamping apparatus connected in parallel with the plurality of capacitors, wherein the busbar arrangement further includes a clamp busbar connected to the capacitor busbar configured to connect the DC crowbar thyristor and clamping apparatus in parallel with the plurality of capacitors.

13. A power electronic building block (PEBB), comprising:

a plurality of box type film capacitors;

a plurality of switch modules, each switch module of the plurality of switch modules including a first terminal, a second terminal and a third terminal, at least one first semiconductor switch connected between the first terminal and the third terminal, and at least one second semiconductor switch connected between the second terminal and the third terminal;

a busbar arrangement including one or more busbars connecting the first terminals of the plurality of switch modules together, connecting the second terminals of the plurality of switch modules together, and connecting the plurality of capacitors in parallel across the first terminals and the second terminals of the plurality of switch modules, via a first plurality of connection points, wherein the busbar arrangement includes a capacitor busbar configured to connect the plurality of capacitors in parallel, a main busbar connected to the capacitor busbar, and a switch busbar connected to the main busbar for connecting the plurality of capacitors in parallel across the first terminals and the second terminals of the plurality of switch modules via said main busbar; and at least one AC busbar including a second plurality of connection points connecting the third terminals of the plurality of switch modules together via said at least one AC busbar, and at least one AC terminal point, wherein the second plurality of connection points of the at least one AC busbar are arranged symmetrically along a first direction with respect to a plane perpendicularly intersecting the first direction, and wherein the at least one AC busbar includes a hole elongated along the first direction and configured to balance one or more loop inductances between the at least one AC terminal point and the second plurality of connection points.

14. The PEBB according to claim 13, further including a DC crowbar thyristor and clamping apparatus connected in parallel with the plurality of capacitors, wherein the main busbar is further configured for connecting the DC crowbar thyristor clamp in parallel with the plurality of capacitors.

* * * * *